(12) United States Patent
Kwon (10) Patent No.: US 7,960,222 B1
(45) Date of Patent: Jun. 14, 2011

(54) SYSTEM AND METHOD FOR MANUFACTURING DOUBLE EPI N-TYPE LATERAL DIFFUSION METAL OXIDE SEMICONDUCTOR TRANSISTORS

(75) Inventor: Taehun Kwon, Scarborough, ME (US)

(73) Assignee: National Semiconductor Corporation, Santa Clara, CA (US)

(*) Notice: Subject to any disclaimer, the term of this patent is extended or adjusted under 35 U.S.C. 154(b) by 518 days.

(21) Appl. No.: 11/986,498

(22) Filed: Nov. 21, 2007

(51) Int. Cl.
*H01L 21/336* (2006.01)

(52) U.S. Cl. ......................... 438/197; 438/357; 438/341

(58) Field of Classification Search .................. 257/372; 438/197
See application file for complete search history.

(56) References Cited

U.S. PATENT DOCUMENTS

| | | | |
|---|---|---|---|
| 5,585,294 A | 12/1996 | Smayling et al. | |
| 6,084,254 A | 7/2000 | Kim | |
| 6,607,960 B2 | 8/2003 | Gris et al. | |
| 6,693,339 B1 * | 2/2004 | Khemka et al. | 257/492 |
| 6,902,967 B2 | 6/2005 | Beasom | |
| 6,958,515 B2 | 10/2005 | Hower et al. | |
| 7,205,630 B2 | 4/2007 | Chang et al. | |
| 7,265,416 B2 * | 9/2007 | Choi et al. | 257/343 |
| 2006/0141714 A1 | 6/2006 | Lee | |
| 2008/0093641 A1 * | 4/2008 | Ludikhuize et al. | 257/289 |

\* cited by examiner

*Primary Examiner* — Thanh V Pham
*Assistant Examiner* — Caleb Henry (57) ABSTRACT

A system and a method are disclosed for manufacturing double epitaxial layer N-type lateral diffusion metal oxide semiconductor transistors. In one embodiment two N-type buried layers are used to minimize the operation of a parasitic PNP bipolar transistor. The use of two N-type buried layers increases the base width of the parasitic PNP bipolar transistor without significantly decreasing the peak doping profiles in the two N-type buried layers. In one embodiment two N-type buried layers and one P-type buried layer are used to form a protection NPN bipolar transistor that minimizes the operation of parasitic NPN bipolar transistor. The N-type lateral diffusion metal oxide semiconductor transistors of the invention are useful in inductive full load or half bridge converter circuits that drive very high current.

20 Claims, 11 Drawing Sheets

SYSTEM AND METHOD FOR MANUFACTURING DOUBLE EPI N-TYPE LATERAL DIFFUSION METAL OXIDE SEMICONDUCTOR TRANSISTORS

TECHNICAL FIELD OF THE INVENTION

The present invention is generally directed to methods for manufacturing semiconductor devices and, in particular, to a system and method for manufacturing double epitaxial layer N-type lateral diffusion metal oxide semiconductor transistors.

BACKGROUND OF THE INVENTION

In the semiconductor manufacturing industry diffusion metal oxide semiconductor (DMOS) transistors are commonly used in power integrated circuits. A DMOS transistor comprises a source region and a body region. During the manufacture of a DMOS transistor the source region and the body region are simultaneously diffused so that the channel length of the DMOS transistor is defined by the difference between the two diffusion lengths. The double diffusion feature of the DMOS transistor permits a short channel region to be formed that can control large drain currents by the gate voltage of the DMOS transistor. In a DMOS transistor a drift region is formed between the short channel and the drain of the DMOS transistor.

DMOS transistors are categorized as either vertical DMOS (VDMOS) transistors or lateral DMOS (LDMOS) transistors depending upon the direction of the current path in the transistor. In a lateral DMOS transistor the source region and the drain region are located on approximately the same level of the transistor so that the direction of the current path is generally in a lateral direction.

Figure 1:
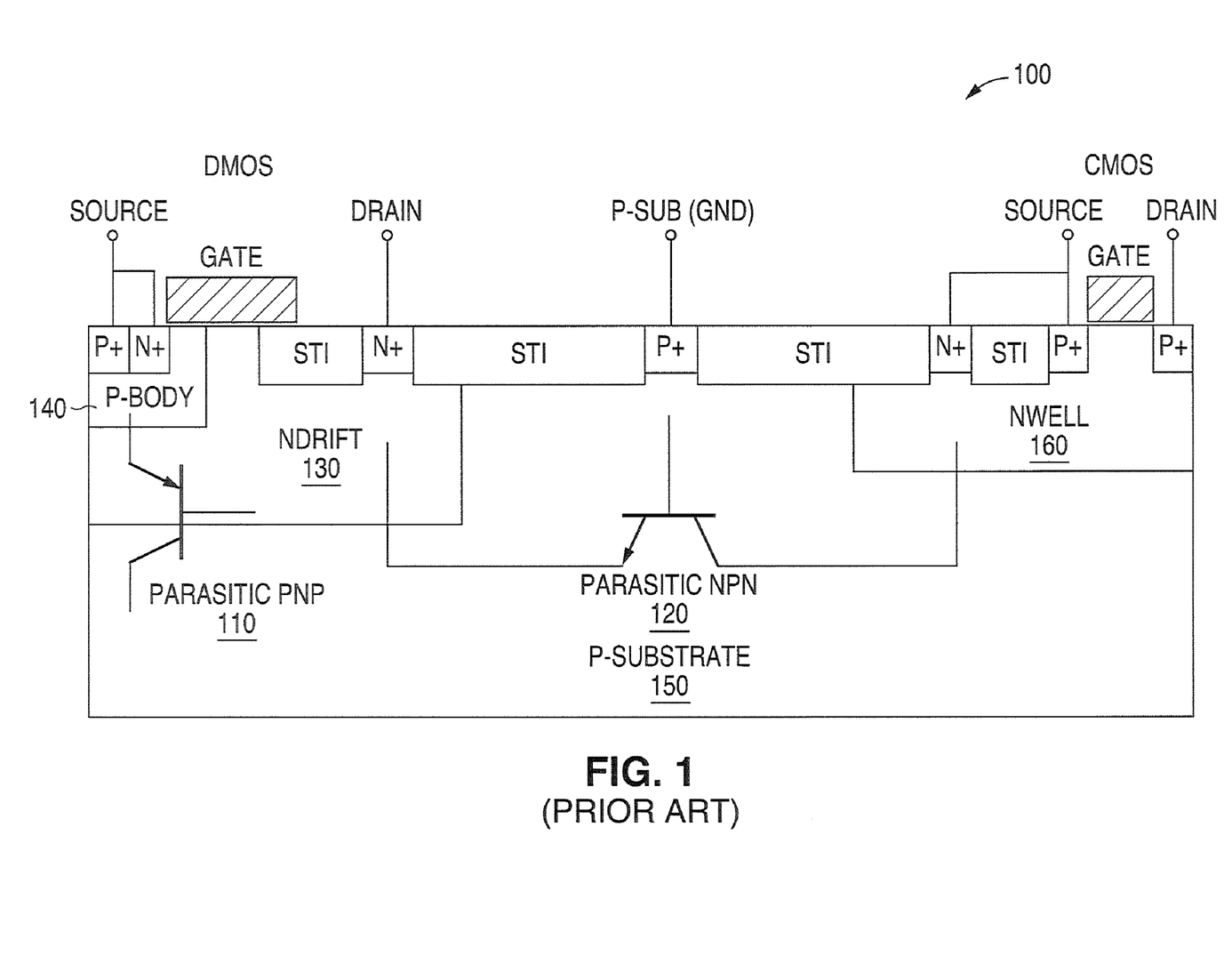
FIG. 1 is a schematic cross sectional view showing a prior art N-type lateral diffusion metal oxide semiconductor (LDMOS) transistor device with a parasitic PNP bipolar transistor and a parasitic NPN bipolar transistor.

Undesirable modes of operation may occur in a DMOS transistor. These undesirable modes of operation are generally referred to as "parasitic" modes of operation. These parasitic modes of operation may take the form of an undesirable parasitic bipolar transistor that is formed within the structure of the DMOS transistor. For example, consider the prior art N-type lateral DMOS device 100 that is shown in FIG. 1. N-type lateral DMOS device 100 is designed to be used for inductive full load or half bridge converters. The letters STI in FIG. 1 refer to and designate "shallow trench isolation" structures in the device 100. As shown in FIG. 1, the structure of device 100 forms a parasitic PNP bipolar transistor 110 on the high side of the device 100 and forms a parasitic NPN bipolar transistor 120 of the low side of the device 100.

The parasitic PNP bipolar transistor 110 is formed in the Ndrift region 130 between the P-type body 140 and the P-substrate 150. The presence of this parasitic PNP bipolar transistor 110 can cause latch up problems in the operation of the N-type lateral DMOS device 100.

The parasitic NPN bipolar transistor 120 is formed in the P-substrate 150 between the Ndrift region 130 and the Nwell 160. The presence of this parasitic NPN bipolar transistor 120 can also cause malfunctions in the operation of the N-type lateral DMOS device 100.

Figure 2:
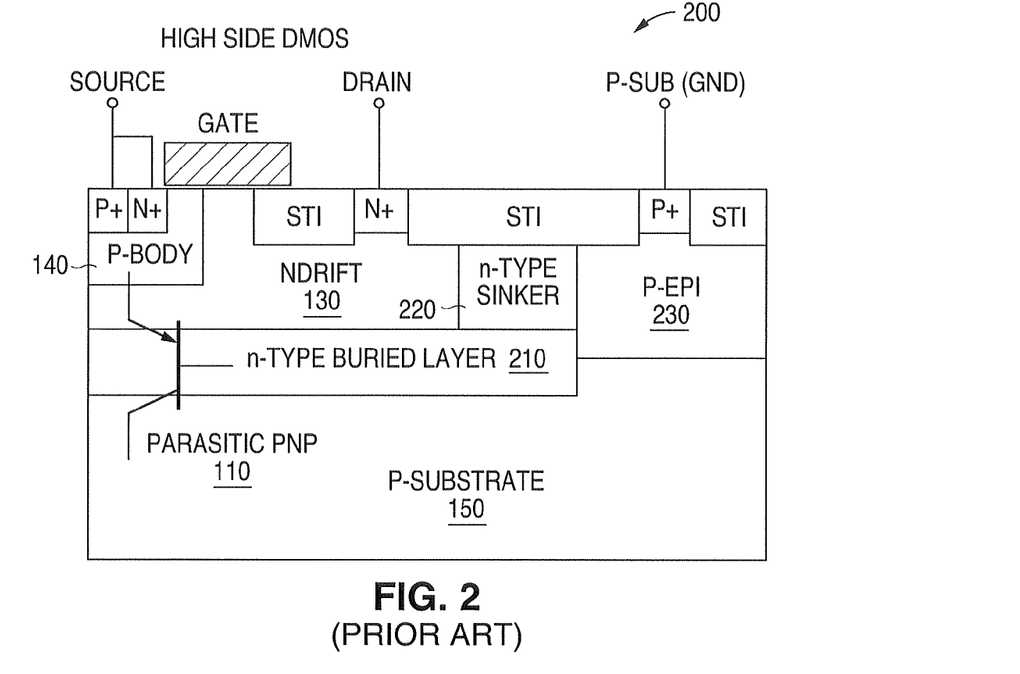
FIG. 2 is a schematic cross sectional view showing a prior art N-type buried layer designed to minimize the effect of a parasitic PNP bipolar transistor in the device shown in FIG. 1.

One prior art approach to reducing the effect of the presence of the parasitic PNP bipolar transistor 110 is shown in the structure 200 that is shown in FIG. 2. A heavily doped N-type buried layer 210 is formed between the Ndrift region 130 and the P-substrate 150. The heavily doped N-type buried layer 210 forms the base of the parasitic PNP bipolar transistor 110. A heavily doped N-type sinker 220 is provided from a shallow trench isolation (STI) structure down to the N-type buried layer 210. The N-type sinker 220 separates the Ndrift region 130 from a P-type epitaxial layer 230 (P-EPI 230) as shown in FIG. 2.

Figure 3:
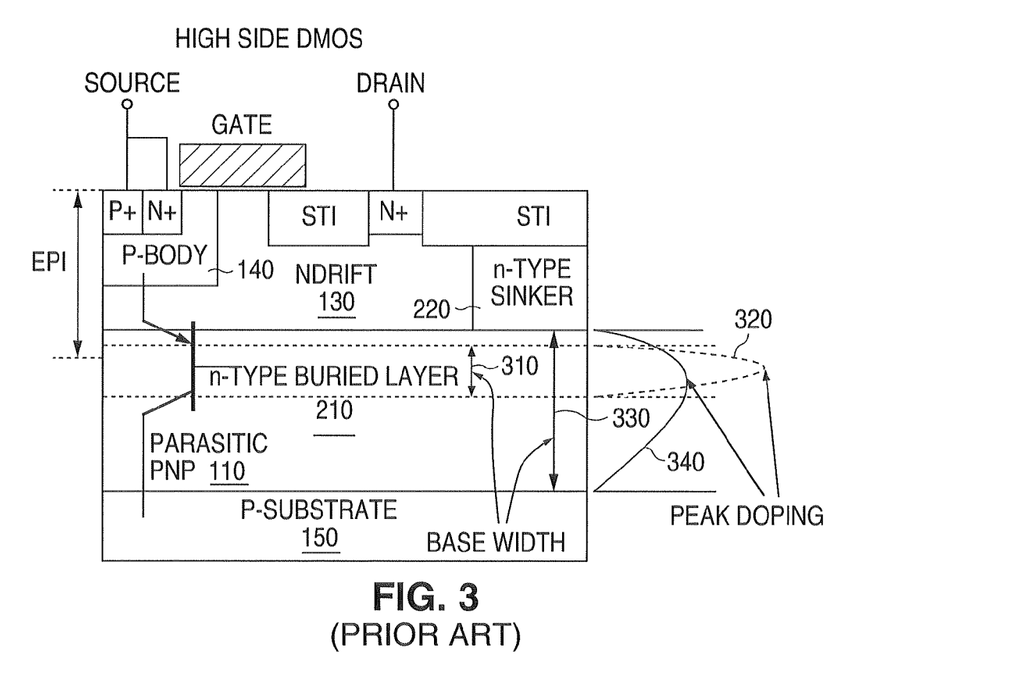
FIG. 3 is a schematic cross sectional view showing two different base widths and associated doping profiles for the prior art N-type buried layer that is shown in FIG. 2.

In order to minimize the beta of the parasitic PNP bipolar transistor 110 it is necessary to have a wide base width and a high doping concentration. However, the width of the N-type buried layer 210 is determined by the diffusion process. This means that it is not possible to simultaneously achieve a wide base width and a high doping concentration. This is illustrated in the structure 300 that is shown FIG. 3. When the width of the N-type buried layer 210 has a relatively small base width (designated with the numeral 310 in FIG. 3) then the peak doping profile is relatively high (designated with the numeral 320 in FIG. 3). When the width of the N-type buried layer 210 has a relatively wide base width (designated with the numeral 330 in FIG. 3) then the peak doping profile is relatively low (designated with the numeral 340 in FIG. 3). This prior art approach has a significant limitation in that it is not possible to achieve both a wide base width and a high doping concentration at the same time.

Figure 4:
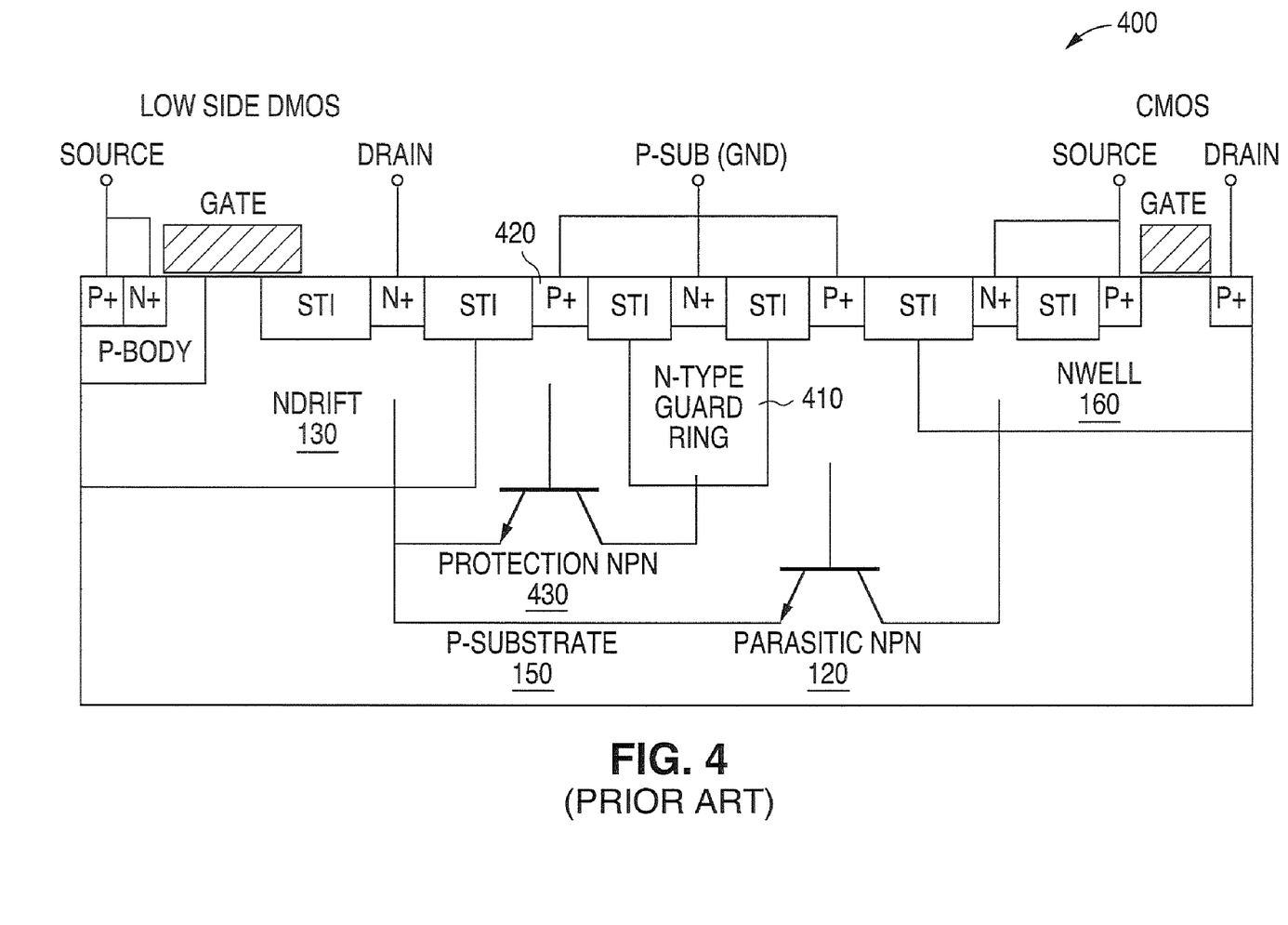
FIG. 4 is a schematic cross sectional view showing a prior art N-type guard ring designed to minimize the effect of a parasitic NPN bipolar transistor in the device shown in FIG. 1.

One prior art approach to reducing the effect of the presence of the parasitic NPN bipolar transistor 120 is shown in the structure 400 that is shown in FIG. 4. A heavily doped N-type guard ring 410 is formed in the P-Substrate 150 as shown in FIG. 4. A P-type region 420 is also formed between the "shallow trench isolation" structures as shown in FIG. 4.

This causes a protection NPN bipolar transistor 430 to be formed between the Ndrift region 130 and N-type guard ring 410. The P-type region 420 provides the base of the protection NPN bipolar transistor 430. The Ndrift region 130 provides the emitter for the protection NPN bipolar transistor 430 and the N-type guard ring 410 provides the collector for the protection NPN bipolar transistor 430.

As the collector of the protection NPN bipolar transistor 430 the N-type guard ring 410 reduces the amount of current that flows from the Nwell 160. However, in spite of the helpful effect of the presence of the protection NPN bipolar transistor 430, the parasitic NPN bipolar transistor 120 still exists. Therefore, there is still some current flowing from the Nwell 160 that contributes to the malfunction of the structure 400 that is shown in FIG. 4. This prior art approach has a significant limitation in that it is not possible to completely stop the current that is due to the presence of the parasitic NPN bipolar transistor 120.

Therefore, there is a need in the art for a system and method that is capable of manufacturing lateral diffusion metal oxide semiconductor (LDMOS) transistors that reduces and minimizes the effect of parasitic bipolar transistors within the lateral diffusion metal oxide semiconductor (LDMOS) transistors.

SUMMARY OF THE INVENTION

To address the above-discussed deficiencies of the prior art, it is a primary object of the present invention to provide a manufacturing method that reduces and minimizes the effect of parasitic bipolar transistors within lateral diffusion metal oxide semiconductor (LDMOS) transistors.

An advantageous embodiment of the invention comprises an N-type lateral diffusion metal oxide semiconductor (LDMOS) transistor device that minimizes the effect of a parasitic PNP bipolar transistor within the LDMOS transistor device. This embodiment of the LDMOS transistor device comprises a first N-type buried layer and a second N-type buried layer. The use of two buried layers increases the effective base width of the parasitic PNP bipolar transistor without decreasing the peak doping concentration in the base of the PNP bipolar transistor. This minimizes the effect of the parasitic PNP bipolar transistor.

Another advantageous of the invention comprises an N-type lateral diffusion metal oxide semiconductor (LDMOS) transistor device that minimizes the effect of a parasitic NPN bipolar transistor within the LDMOS transistor device. This embodiment of the LDMOS transistor device comprises a first N-type buried layer. A second N-type buried layer is formed on a first portion of the first N-type buried layer and a P-type buried layer is formed on a second portion of the first N-type buried layer. A Pwell is also formed that extends down to the P-type buried layer. These structures form a protection PNP bipolar transistor that minimizes the effect of the parasitic NPN bipolar transistor.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 5 through 13 and the various embodiments used to describe the principles of the present invention in this patent document are by way of illustration only and should not be construed in any way to limit the scope of the invention. Those skilled in the art will understand that the principles of the present invention may be implemented in any type of suitably arranged lateral diffusion metal oxide semiconductor (LDMOS) transistor device. To simplify the drawings the reference numerals from previous drawings will sometimes not be repeated for structures that have already been identified.

The method of the present invention for manufacturing an N-type lateral diffusion metal oxide semiconductor (LDMOS) transistor device creates two N-type buried layers and creates two epitaxial layers. The method of manufacture will be described in more detail later in this patent document.

Figure 5:
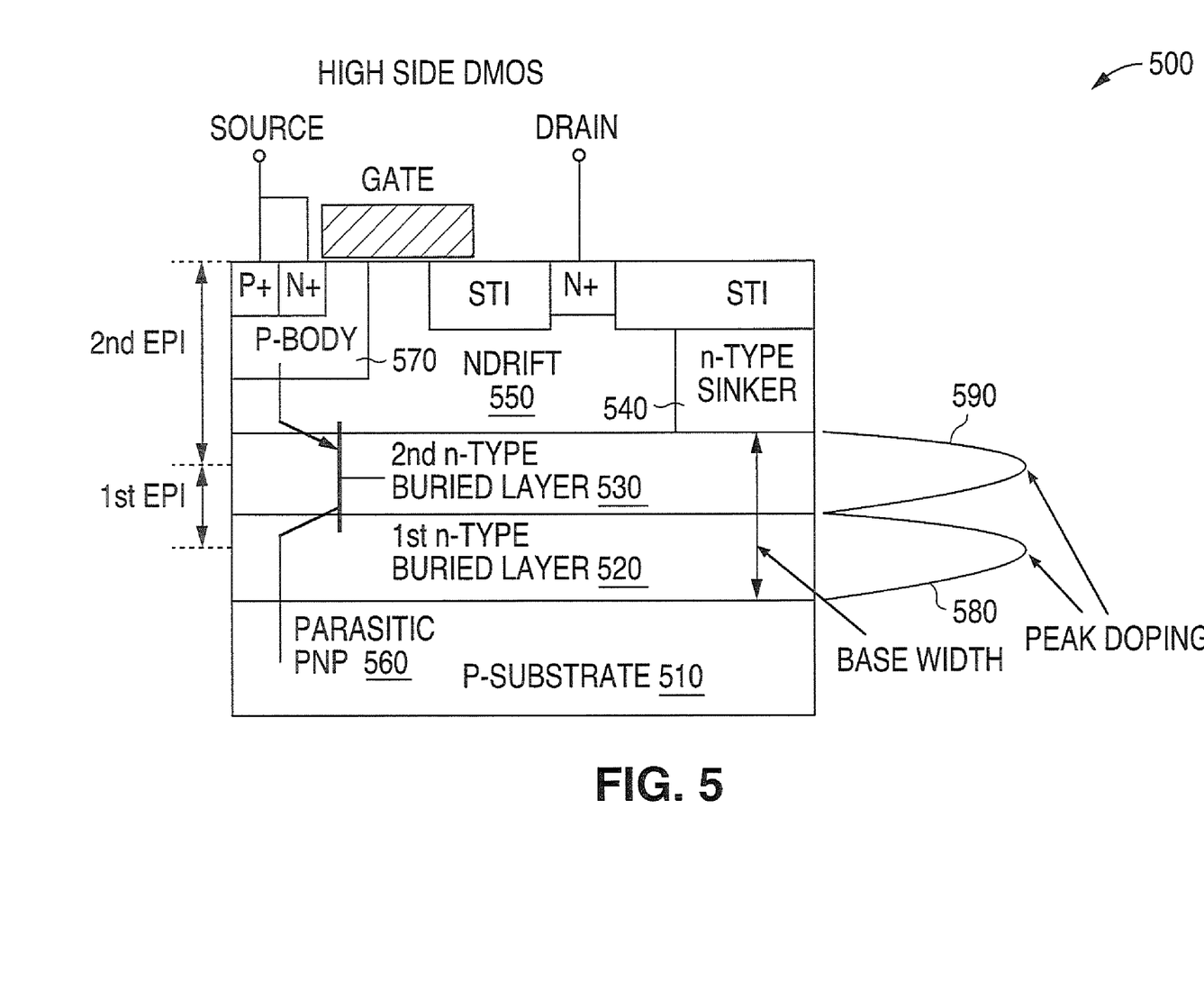
FIG. 5 is a schematic cross sectional view showing an advantageous embodiment of an N-type lateral diffusion metal oxide semiconductor (LDMOS) transistor device of the present invention that minimizes the effect of a parasitic PNP bipolar transistor.

FIG. 5 is a schematic cross sectional view showing an advantageous embodiment of an N-type lateral diffusion metal oxide semiconductor (LDMOS) transistor device 500 of the present invention that minimizes an operation of a parasitic PNP bipolar transistor that is present in the LMDMOS transistor device 500. Device 500 comprises a P-Substrate 510. A first N-type buried layer 520 is formed on the P-Substrate 510. A second N-type buried layer 530 is formed on the first N-type buried layer 520.

A heavily doped N-type sinker 540 is provided from a shallow trench isolation (STI) structure down to the second N-type buried layer 530. The N-type sinker 540 separates the Ndrift region 550 from the second epitaxial layer (not shown in FIG. 5). The parasitic PNP bipolar transistor 560 extends from the P-type body 570 through the second N-type buried layer 530 and through the first N-type buried layer 520 down to the P-Substrate 510.

The use of two N-type buried layers (520 and 530) increases the effective base width without sacrificing the peak doping concentration. FIG. 5 shows that the peak doping profile for the first N-type buried layer 520 (designated with the numeral 580 in FIG. 5) is relatively high. FIG. 5 shows that the peak doping profile for the second N-type buried layer 530 (designated with the numeral 590 in FIG. 5) is also relatively high.

The manufacturing method of the present invention provides both a relatively wide base width and a relatively high doping concentration for the base of the parasitic PNP bipolar transistor 560. The combination of these features minimizes the beta of the parasitic PNP bipolar transistor 560.

Figure 6:
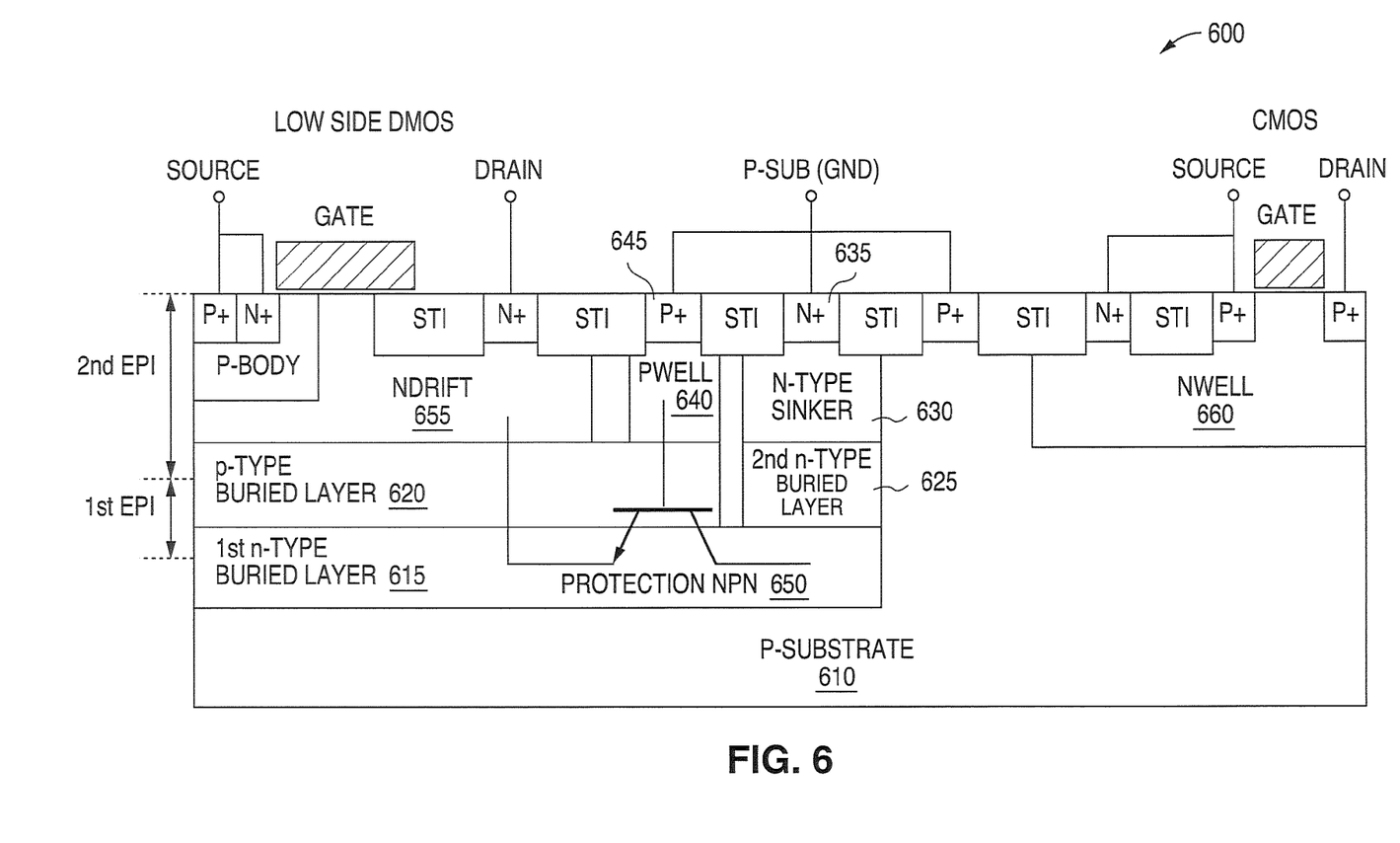
FIG. 6 is a schematic cross sectional view showing an advantageous embodiment of an N-type lateral diffusion metal oxide semiconductor (LDMOS) transistor device of the present invention that minimizes the effect of a parasitic NPN bipolar transistor.

FIG. 6 is a schematic cross sectional view showing an advantageous embodiment of an N-type lateral diffusion metal oxide semiconductor (LDMOS) transistor device 600 of the present invention that minimizes an operation of a parasitic NPN bipolar transistor that is present in the LDMOS transistor device 600. Device 600 comprises a P-Substrate 610. A first N-type buried layer 615 is formed on the P-Substrate 610. A P-type buried layer 620 and a second N-type buried layer 625 is formed on the first N-type buried layer 615.

A heavily doped N-type sinker 630 is provided that extends from an N-type region 635 down to the second N-type buried layer 625. A Pwell 640 is provided from a P-type region 645 down to the P-type buried layer 620. A protection NPN bipolar transistor 650 is formed having (1) a collector connected to the first N-type buried layer 615 and (2) a base connected to the Pwell 640 and (3) an emitter connected to the Ndrift region 655 through the first N-type buried layer 615 and through the P-type buried layer 620. The parasitic NPN bipolar transistor that would otherwise be connected to Nwell 660 is completely removed.

The N-type lateral diffusion metal oxide semiconductor (LDMOS) transistor device 500 that is shown in FIG. 5 represents a high side LDMOS transistor device. The N-type lateral diffusion metal oxide semiconductor (LDMOS) transistor device 600 that is shown in FIG. 6 represents a low side LDMOS transistor device. These devices provide efficient an LDMOS structure for inductive full load or half bridge converter circuits driving very high current.

FIGS. 7 through 11 illustrate sequential steps in the manufacture of an N-type lateral diffusion metal oxide semiconductor (LDMOS) transistor device of the present invention in accordance with an advantageous embodiment of the method of the present invention.

Figure 7:
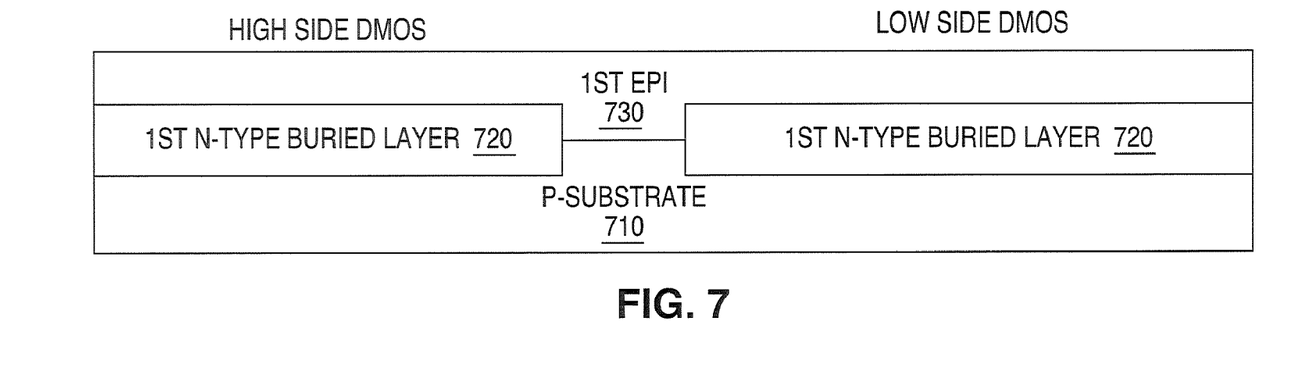
FIGS. 7 through 11 illustrate sequential steps in the manufacture of an N-type lateral diffusion metal oxide semiconductor (LDMOS) transistor device of the present invention in accordance with an advantageous embodiment of the method of the present invention.

A P-Substrate 710 is formed in the first step of the manufacturing method. A high side DMOS structure will be formed on the left side of FIG. 7 and a low side DMOS structure will be formed on the right side of FIG. 7. Then a first N-type buried layer mask and implant procedure (and buried layer drive in procedure) is performed to form the first N-type buried layer 720. Then the first epitaxial layer 730 (1$^{st}$ EPI 730) is formed. The result of these steps is shown in FIG. 7.

Figure 8:
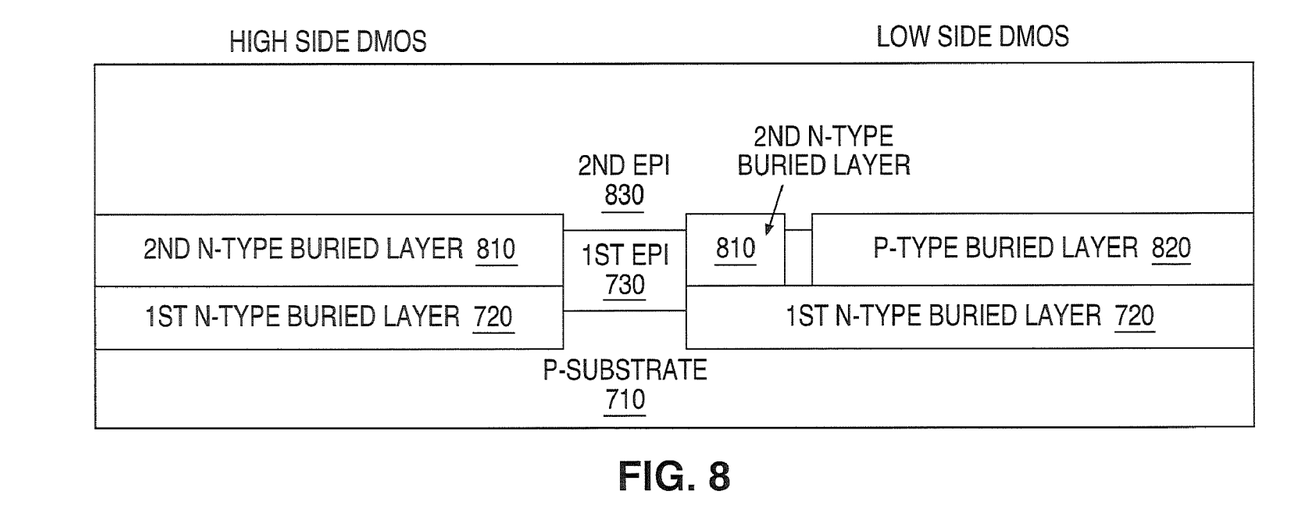

In the next step a second N-type buried layer mask and implant procedure (and buried layer drive in procedure) is performed to form the second N-type buried layer 810. Then a P-type buried layer mask and implant procedure (and buried layer drive in procedure) is performed to form the P-type buried layer 820. Then the second epitaxial layer 830 (2$^{nd}$ EPI 830) is formed. The result of these steps is shown in FIG. 8.

Figure 9:
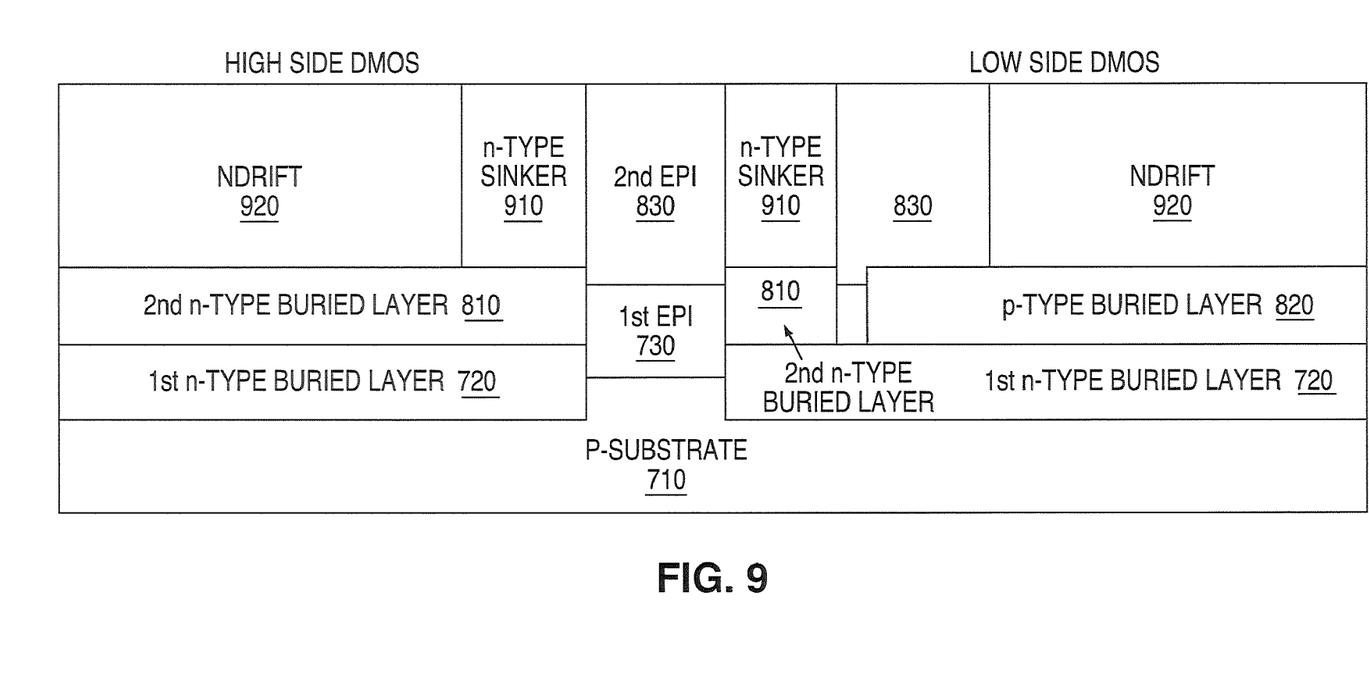

Then an N-type sinker mask and implant procedure is performed to form N-type sinker 910 through the second epitaxial layer 830 down to the second N-type buried layer 810. Then an Ndrift mask and implant procedure (and drive in procedure) is performed to form the Ndrift region 920 down to the second N-type buried layer 810. The result of these steps is shown in FIG. 9.

Figure 10:
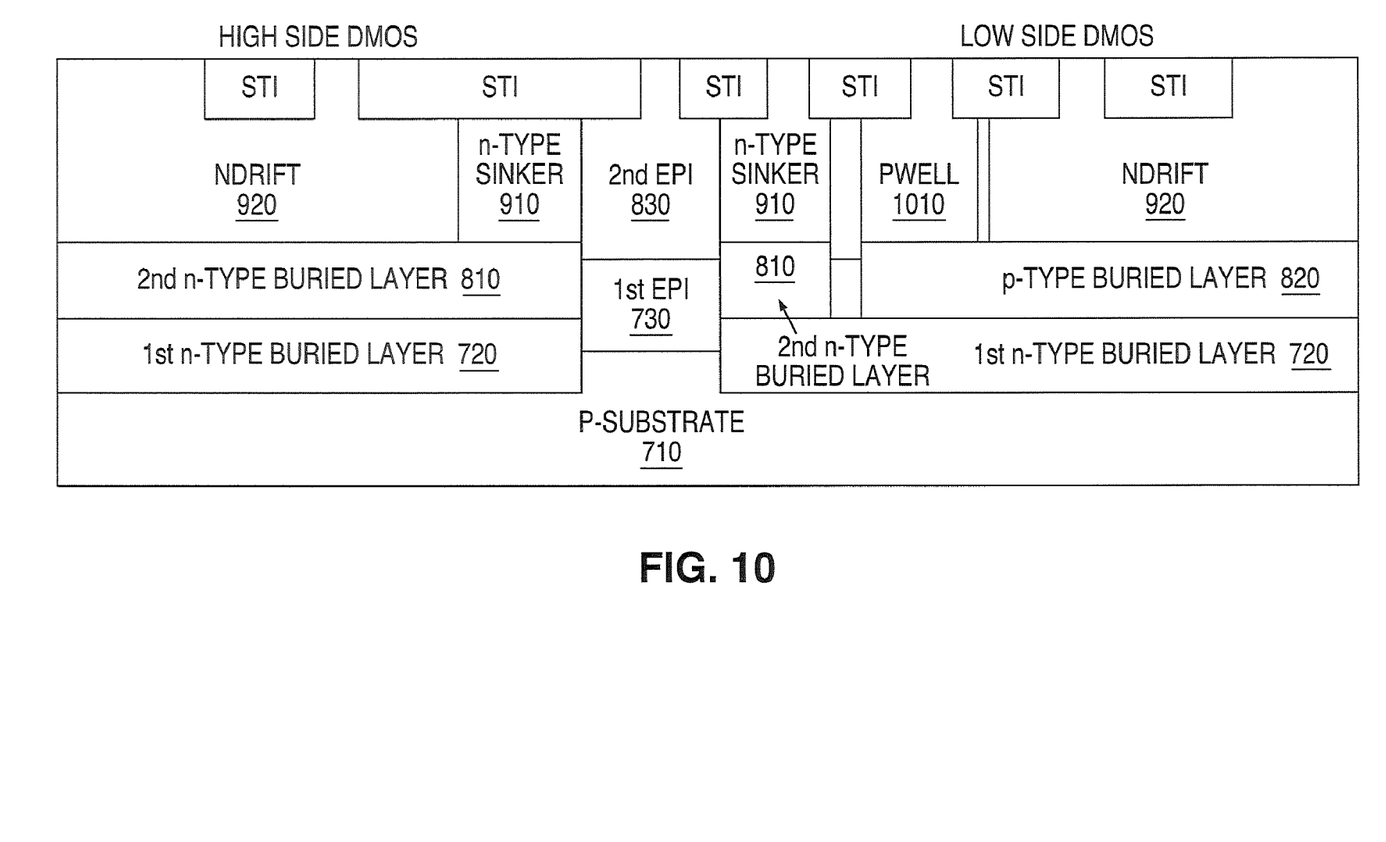

Then a conventional composite (STI) process is used to form shallow trench isolation (STI) regions as shown in FIG. 10. Then a Pwell mask and implant procedure is performed to form the Pwell region 1010. The result of these steps is shown in FIG. 10.

Figure 11:
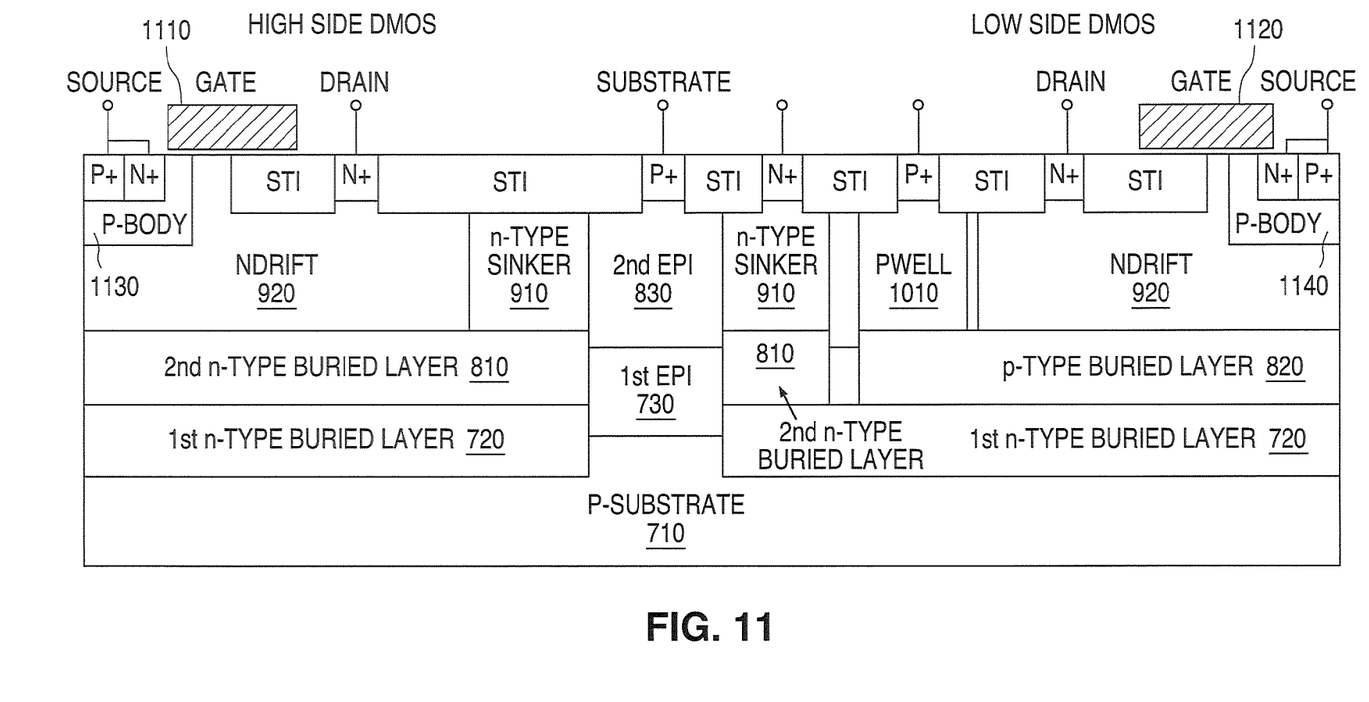

Then a gate deposit procedure and a gate mask and etch procedure is performed to form gate 1110 and gate 1120. Next a mask and implant procedure is performed to form P-type body 1130 and to form P-type body 1140. Then an NLDD and PLDD mask and implant procedure is performed and an N+ and P+ mask and implant procedure is performed to form the N+ and P+ regions (not numbered in FIG. 11). Then an anneal process is performed and a metallization process is performed to complete the manufacturing process. The final result of the manufacturing process is shown in FIG. 11.

The manufacturing process described with reference to FIGS. 7 through 11 illustrates how to simultaneously manufacture a high side DMOS device and a low side DMOS device of the present invention. It is also possible to separately manufacture the high side DMOS device and the low side DMOS device of the present invention. This is shown in FIG. 12 and in FIG. 13.

Figure 12:
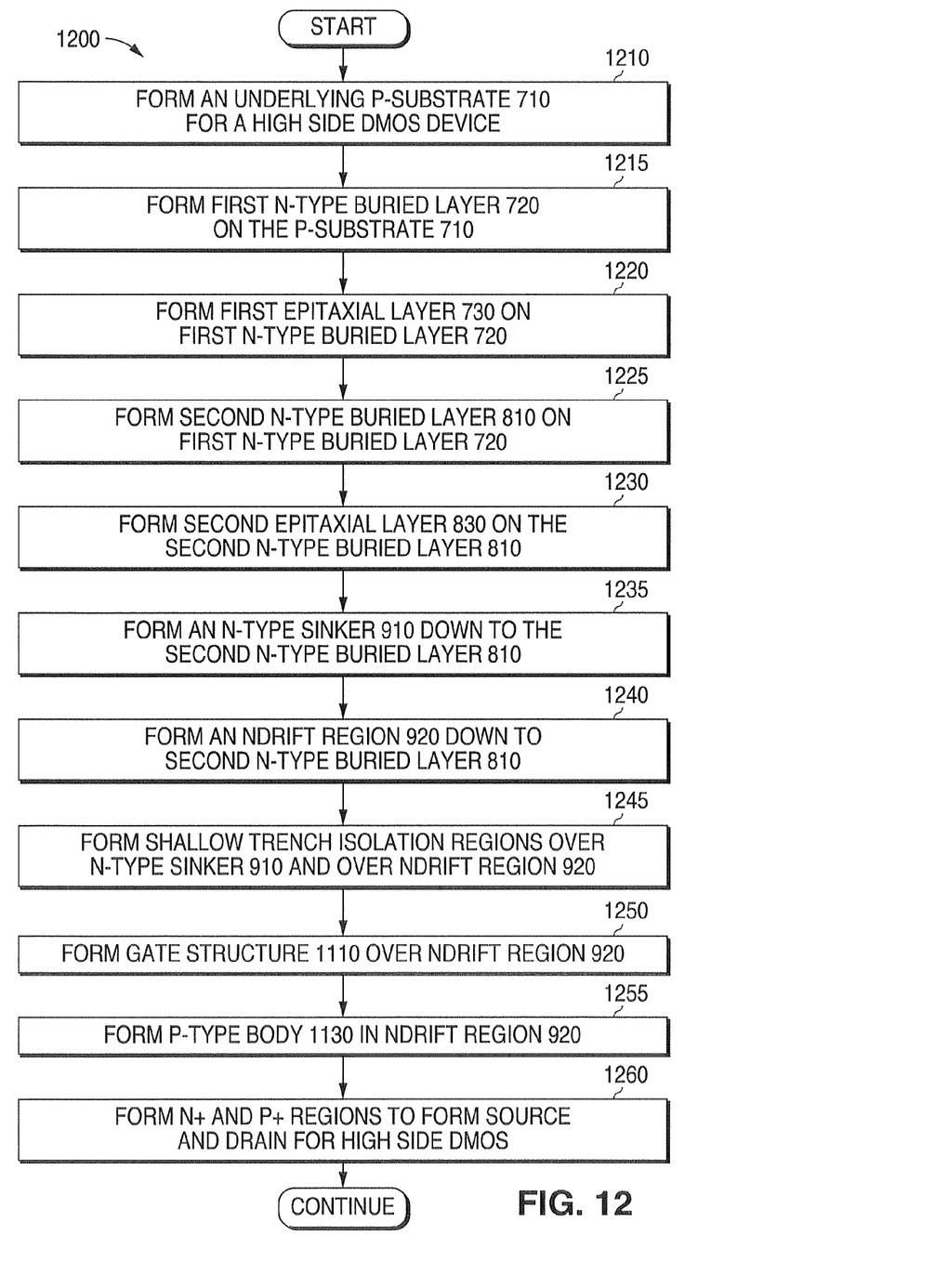
FIG. 12 illustrates a flow chart showing the steps of an advantageous embodiment of the method of the present invention for manufacturing a high side DMOS device.

FIG. 12 illustrates a flow chart 1200 showing the steps of an advantageous embodiment of the method of the invention for manufacturing a high side DMOS device. In the first step of the method 1200 an underlying P-substrate 710 is provided (step 1210). Then a first N-type buried layer 720 is formed on the P-substrate 710 (step 1215). Then a first epitaxial layer 730 is formed on the first N-type buried layer 720 (step 1220).

Then a second N-type buried layer 810 is formed on the first N-type buried layer 720 (step 1225). Then a second epitaxial layer 830 is formed on the second N-type buried layer 810 (step 1230). Then an N-type sinker 910 is formed through the second epitaxial layer 830 down to the second N-type buried layer 810 (step 1235). Then an Ndrift region 920 is formed down to the second N-type buried layer 810 (step 1240).

Then shallow trench isolation regions are formed over the N-type sinker 910 and over the Ndrift region 920 (step 1245). Then a gate structure 1110 is formed over the Ndrift region 920 (step 1250). Then a P-type body 1130 is formed in the Ndrift region 920 (step 1255). Then N+ and P+ regions are formed to form the source and drain regions for the high side DMOS device (step 1260).

Figure 13:
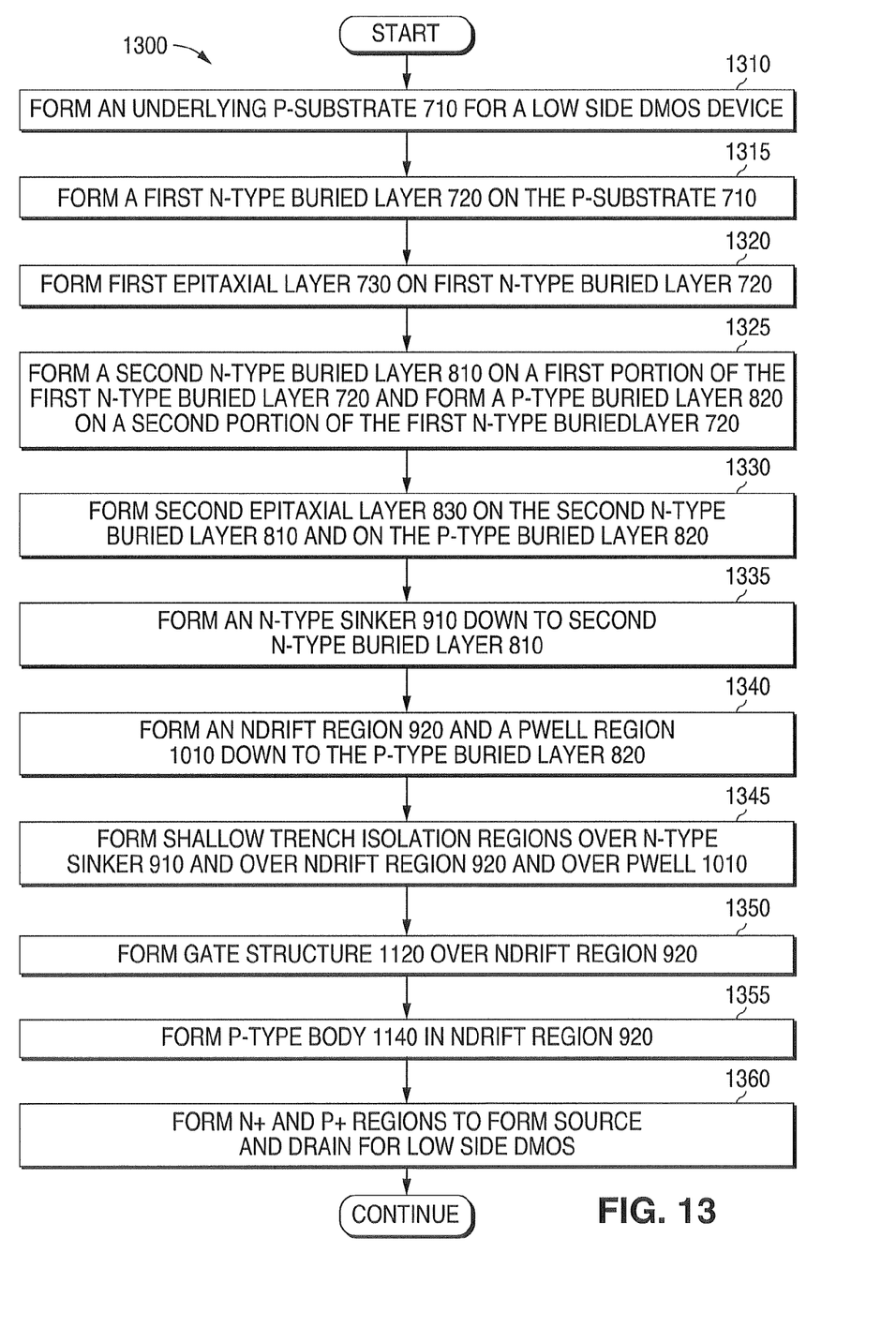
FIG. 13 illustrates a flow chart showing the steps of an advantageous embodiment of the method of the present invention for manufacturing a low side DMOS device.

FIG. 13 illustrates a flow chart 1300 showing the steps of an advantageous embodiment of the method of the invention for manufacturing a low side DMOS device. In the first step of the method 1300 an underlying P-substrate 710 is provided (step 1310). Then a first N-type buried layer 720 is formed on the P-substrate 710 (step 1315). Then a first epitaxial layer 730 is formed on the first N-type buried layer 720 (step 1320).

Then a second N-type buried layer 810 is formed on a first portion of the first N-type buried layer 720 and a P-type buried layer 820 is formed on a second portion of the first N-type buried layer 720 (step 1325). Then a second epitaxial layer 830 is formed on the second N-type buried layer 810 and on the P-type buried layer 820 (step 1330). Then an N-type sinker 910 is formed through the second epitaxial layer 830 down to the second N-type buried layer 810 (step 1335). Then an Ndrift region 920 and a Pwell region 1010 are formed down to the P-type buried layer 820 (step 1340).

Then shallow trench isolation regions are formed over the N-type sinker 910 and over the Ndrift region 920 and over the Pwell 1010 (step 1345). Then a gate structure 1120 is formed over the Ndrift region 920 (step 1350). Then a P-type body 1140 is formed in the Ndrift region 920 (step 1355). Then N+ and P+ regions are formed to form the source and drain regions for the low side DMOS device (step 1360).

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing an N-type lateral diffusion metal oxide semiconductor (LDMOS) transistor, wherein the method comprises the steps of:
   forming a first N-type buried layer over a P-type substrate;
   forming a first epitaxial layer over the first N-type buried layer;
   forming a second N-type buried layer over a first portion of the first N-type buried layer;
   forming a P-type buried layer over a second portion of the first N-type buried layer, the P-type buried layer next to the second N-type buried layer;
   forming a second epitaxial layer over the second N-type buried layer and over the P-type buried layer;
   wherein an Ndrift region in the second epitaxial layer, a P well region in the second epitaxial layer, and the first N-type buried layer form a protection NPN bipolar transistor in the LDMOS transistor.

2. The method as set forth in claim 1, further comprising the steps of:
   forming an N-type sinker through the second epitaxial layer down to the second N-type buried layer;
   forming the Ndrift region in the second epitaxial layer down to the P-type buried layer;
   forming the P well region in the second epitaxial layer down to the P-type buried layer, the P well region next to the Ndrift region; and
   forming a first shallow trench isolation region over the N-type sinker and over a first portion of the P well region, a second shallow trench isolation region over a second portion of the P well region and over a first portion of the Ndrift region, and a third shallow trench isolation region over a second portion of the Ndrift region.

3. The method as set forth in claim 2, further comprising the steps of:
   forming a gate structure over the Ndrift region;
   forming a P-type body in the Ndrift region;
   forming a source region in the P-type body; and
   forming a drain region in the Ndrift region between the second and third shallow trench isolation regions.

4. The method as set forth in claim 3, wherein the protection NPN bipolar transistor minimizes an operation of a parasitic NPN bipolar transistor formed between the LDMOS transistor and an adjacent complimentary metal oxide semiconductor (CMOS) device.

5. The method as set forth in claim 4, wherein:
   a collector of the protection NPN bipolar transistor is connected to the first N-type buried layer;
   a base of the protection NPN bipolar transistor is connected to the P well region; and
   an emitter of the protection NPN bipolar transistor is connected to the Ndrift region through the first N-type buried layer and through the P-type buried layer.

6. A method for manufacturing high-side and low-side N-type lateral diffusion metal oxide semiconductor (LDMOS) transistors, wherein the method comprises:
   forming a first N-type buried layer over a P-type substrate;
   forming a first epitaxial layer over the first N-type buried layer;
   forming a second N-type buried layer over the first N-type buried layer, wherein the second N-type buried layer is formed directly on the first N-type buried layer and covers substantially all of the first N-type buried layer within the high-side LDMOS transistor, and wherein the second N-type buried layer is formed over a first portion of the first N-type buried layer within the low-side LDMOS transistor;
   forming a P-type buried layer over a second portion of the first N-type buried layer within the low-side LDMOS transistor, the P-type buried layer next to the second N-type buried layer;
   forming a second epitaxial layer over the second N-type buried layer and over the P-type buried layer; and
   forming a second epitaxial layer over the second N-type buried layer;
   wherein a P-type body in the second epitaxial layer, the first and second N-type buried layers, and the P-type substrate form a parasitic PNP bipolar transistor in the high-side LDMOS transistor; and
   wherein an Ndrift region in the second epitaxial layer, a P well region in the second epitaxial layer, and the first N-type buried layer form a protection NPN bipolar transistor in the low-side LDMOS transistor.

7. The method of claim 6, further comprising:
   forming an N-type sinker through the second epitaxial layer down to the second N-type buried layer within the high-side LDMOS transistor;
   forming a second Ndrift region in the second epitaxial layer down to the second N-type buried layer within the high-side LDMOS transistor; and
   forming a first shallow trench isolation region over the N-type sinker and over a first portion of the second Ndrift region and a second shallow trench isolation region over a second portion of the second Ndrift region within the high-side LDMOS transistor.

8. The method of claim 7, further comprising:
   forming a gate structure over the second Ndrift region within the high-side LDMOS transistor;
   forming the P-type body in the second Ndrift region within the high-side LDMOS transistor;
   forming a source region in the P-type body within the high-side LDMOS transistor; and
   forming a drain region in the second Ndrift region between the first and second shallow trench isolation regions within the high-side LDMOS transistor.

9. The method of claim 8, wherein a combined width of the first N-type buried layer and the second N-type buried layer in the high-side LDMOS transistor minimizes an operation of the parasitic PNP bipolar transistor in the high-side LDMOS transistor.

10. The method of claim 8, wherein a peak doping profile of the first N-type buried layer and a peak doping profile of the second N-type buried layer in the high-side LDMOS transistor minimize an operation of the parasitic PNP bipolar transistor in the high-side LDMOS transistor.

11. The method of claim 6, further comprising:
    forming an N-type sinker through the second epitaxial layer down to the second N-type buried layer within the low-side LDMOS transistor;
    forming the Ndrift region in the second epitaxial layer down to the P-type buried layer within the low-side LDMOS transistor;
    forming the P well region in the second epitaxial layer down to the P-type buried layer within the low-side LDMOS transistor, the P well region next to the Ndrift region; and
    forming a first shallow trench isolation region over the N-type sinker and over a first portion of the P well region, a second shallow trench isolation region over a second portion of the P well region and over a first portion of the Ndrift region, and a third shallow trench isolation region over a second portion of the Ndrift region within the low-side LDMOS transistor.

12. The method of claim 11, further comprising:
forming a gate structure over the Ndrift region within the low-side LDMOS transistor;
forming a P-type body in the Ndrift region within the low-side LDMOS transistor;
forming a source region in the P-type body within the low-side LDMOS transistor; and
forming a drain region in the Ndrift region between the second and third shallow trench isolation regions within the low-side LDMOS transistor.

13. The method of claim 12, wherein the protection NPN bipolar transistor formed within the low-side LDMOS transistor minimizes an operation of a second parasitic NPN bipolar transistor.

14. The method of claim 13, wherein:
a collector of the protection NPN bipolar transistor is connected to the first N-type buried layer within the low-side LDMOS transistor;
a base of the protection NPN bipolar transistor is connected to the P well region within the low-side LDMOS transistor; and
an emitter of the protection NPN bipolar transistor is connected to the Ndrift region through the first N-type buried layer and through the P-type buried layer within the low-side LDMOS transistor.

15. The method of claim 12, wherein the protection NPN bipolar transistor formed within the low-side LDMOS transistor eliminates formation of a second parasitic NPN bipolar transistor between the low-side LDMOS transistor and an adjacent complimentary metal oxide semiconductor (CMOS) device.

16. The method of claim 1, wherein the P-type buried layer is separated from the second N-type buried layer by a portion of the P-type substrate.

17. The method of claim 2, wherein the P well region is separated from the Ndrift region by a portion of the P-type substrate.

18. The method of claim 2, wherein the P well region is separated from the N-type sinker by a portion of the P-type substrate.

19. The method of claim 6, wherein the P-type buried layer is separated from the second N-type buried layer by a portion of the P-type substrate.

20. The method of claim 11, wherein:
the P well region is separated from the Ndrift region by a first portion of the P-type substrate; and
the P well region is separated from the N-type sinker by a second portion of the P-type substrate.

* * * * *